United States Patent [19]

Johnson et al.

[11] 4,143,267
[45] Mar. 6, 1979

[54] DIGITAL DISTANCE MEASURING INSTRUMENT

[76] Inventors: Lonnie G. Johnson, 1463 E. Barkley Dr., Mobile, Ala. 36606; John M. Lederer, 1603 Calle Del Ranchero, Albuquerque, N. Mex. 87106

[21] Appl. No.: 863,685

[22] Filed: Dec. 23, 1977

[51] Int. Cl.$^2$ .......................... G01B 3/02; G01B 3/38; G01D 5/30
[52] U.S. Cl. .............................. 250/231 R; 33/125 A; 33/137 R; 33/143 L; 33/DIG. 3; 250/555; 250/566
[58] Field of Search .................... 250/231 R, 555, 560, 250/566, 568, 570, 215; 33/125 A, 137 R, 143 L, DIG. 3

[56] References Cited

U.S. PATENT DOCUMENTS

| | | | |
|---|---|---|---|
| 3,358,202 | 12/1967 | Pabst et al. | 250/231 R X |
| 3,512,006 | 5/1970 | Haller | 250/231 R |
| 4,008,523 | 2/1977 | Von Voros | 33/143 L |
| 4,035,922 | 7/1977 | Von Voros | 33/143 L |

Primary Examiner—Siegfried H. Grimm

[57] ABSTRACT

An apparatus for making distance measurements with a high degree of accuracy and a means for interpreting and displaying the results on a digital readout. A binary encoded scale which exhibits a one to one correspondence with discrete locations on said scale and the coded information at those locations is used in making the measurements. The scale is made using photographic reducing techniques. An optical detection system, comprising a magnifying lens, a plurality of light conducting fibers and phototransistors is used to read digital information from the binary encoded scale. An electronic circuit accepts digital code from the optical detection system, decodes it and displays the resulting information on a digital readout.

6 Claims, 9 Drawing Figures

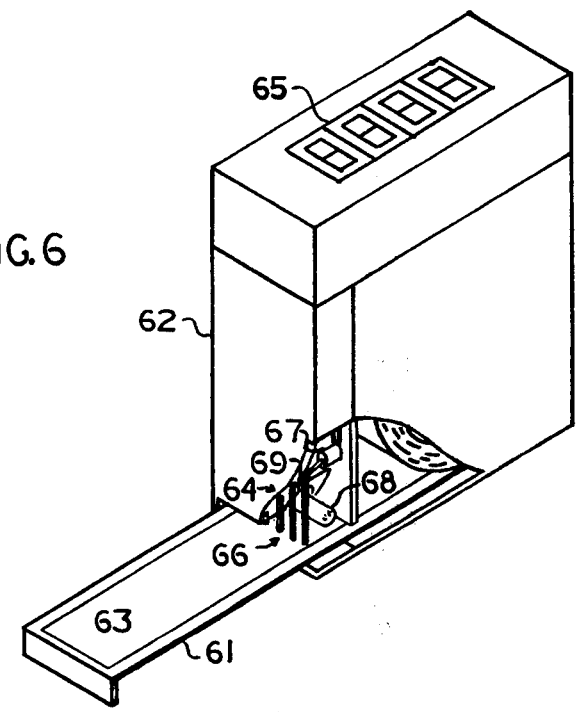
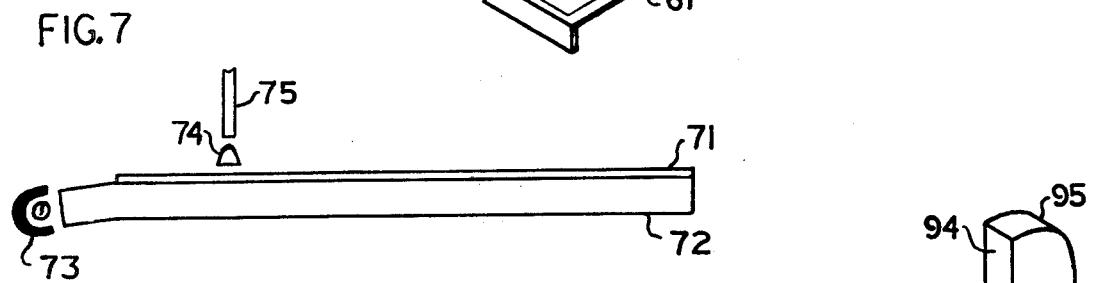
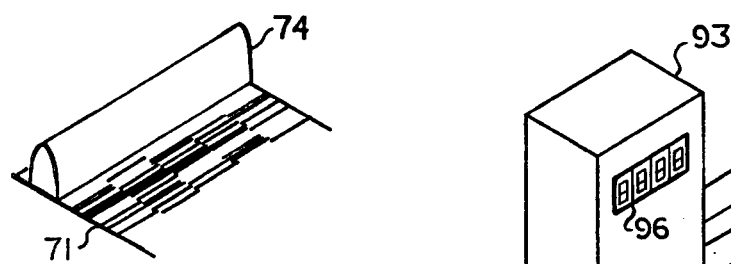
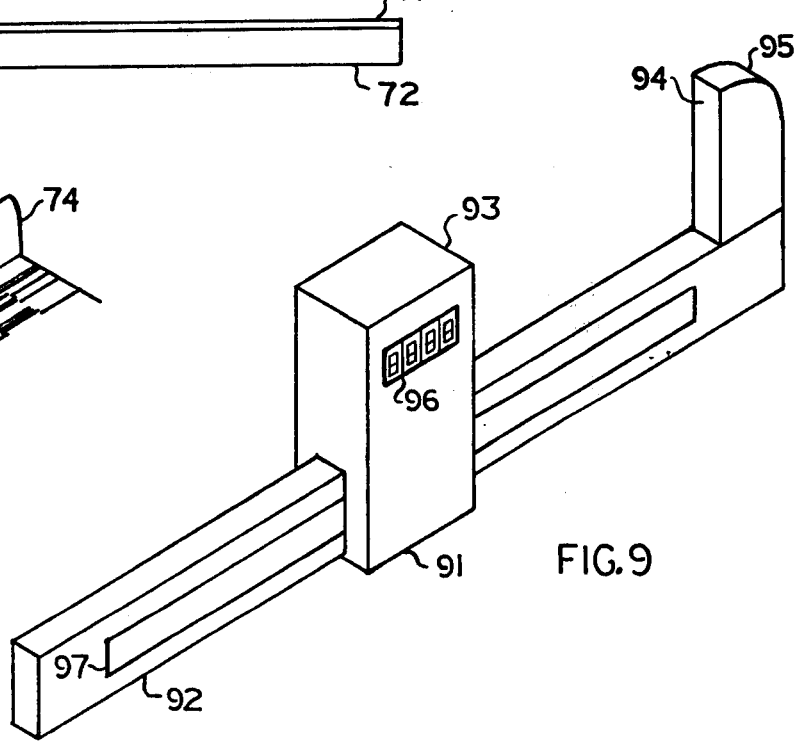

DIGITAL DISTANCE MEASURING INSTRUMENT

BACKGROUND AND SUMMARY OF THE INVENTION

The present invention uses a mechanical analog to digital converter to measure distance. The distance measured is supplied in binary encoded decimal to an electronic decoder for decoding and subsequent decimal display.

The use of mechanical analog to digital converters is not new. However, the accuracy with which the analog information could be converted has been limited by physical requirements of the mechanical device. For example, it was not practical to detect changes in length on the order of a thousandth of an inch (0.001 inch) and convert it into a digital code representing the changes by using a simple mechanical device exclusively. The present invention offers a mechanical device which can be used to make measurements with an accuracy of this order of magnitude or better. A digital scale of binary is used which exhibits a one to one correspondence with discrete locations on the scale, and coded information at those locations. Photographic reducing techniques such as those used to make microfiche make it possible to encode information onto a scale at extremely small increments using extremely small characters so that output inaccuracies caused by the physical requirement that the characters occupy some finite area on the scale is very small. The net effect is that the range of distances input to the device which can result in unchanged digital output is extremely small.

The magnitude of the distance being measured is input to the device in terms of the location on the scale seen by a photoelectric detector. The information at that location is sensed and is subsequently used to control a digital display. The photoelectric detector is comprised of a magnifying lens, light conducting fibers, and phototransistors. Integrated circuits have been used to design a device which gives a digital readout of distance measurements and which has a size close to that of its conventional mechanical counterpart from which distance is interpreted by manually reading a linear scale.

An object of the present invention is to provide a practical device for making measurements of distance by means of mechanical input and to have the input information conveniently converted into a digital code for ease of transmission, electrical conversion, and display.

BRIEF DESCRIPTION OF DRAWINGS

FIG. 6 shows a retractable tape ruler. The distance to which the ruler is extended is presented on a digital readout located on the casing.

FIG. 7 shows an edge view of a light source, a plate of light conducting material, a photographic film on which information has been encoded in terms of transparent and opaque areas, a magnifying lens, and a set of optical fibers. The components are shown arranged in a manner which facilitates the reading of the coded scale on the film.

FIG. 8 shows a one dimensional lens used to magnify the image of the coded information to be read from a scale and interpreted.

FIG. 9 shows a device based on the principles of the present invention and designed to measure thickness. The distance between the inner face of the moveable slide and the inner face of the vertical end member is displayed on the digital readout on the side of the sliding member.

DETAILED DESCRIPTION AND PREFERRED EMBODIMENT OF THE INVENTION

The principles upon which the present invention are based and the improvements offered are presented in detail in the following description with reference to the drawings. Two devices for making accurate distance measurements are given.

Figure 1:
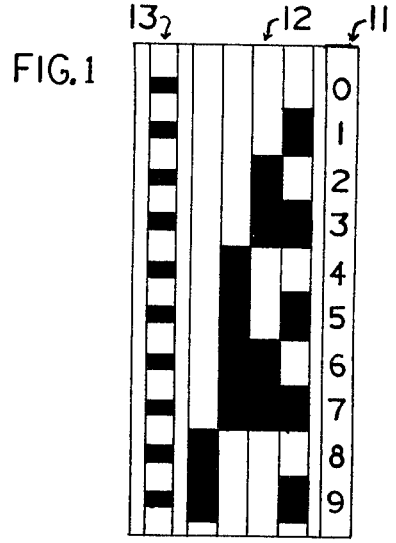
FIG. 1 is an example of a binary coded decimal scale showing a sync column used to assure optical alignment of a given row of coded binary before it is read.

FIG. 1 is a bindary coded decimal scale. Decimal digits 11 on the right side of the scale indicate the decimal equivalent of each row of binary code 12 represented by the light and dark areas. Dark areas 13 of the first column are used to synchronize the reading of a given row of binary code. This is needed because as the optical detectors move along the scale the divisions between light and dark areas between digits will appear as gray areas and erroneous information may be interpreted. The sync column assures that the detectors are correctly aligned with a row of coded information before a read signal is generated.

Figure 2:
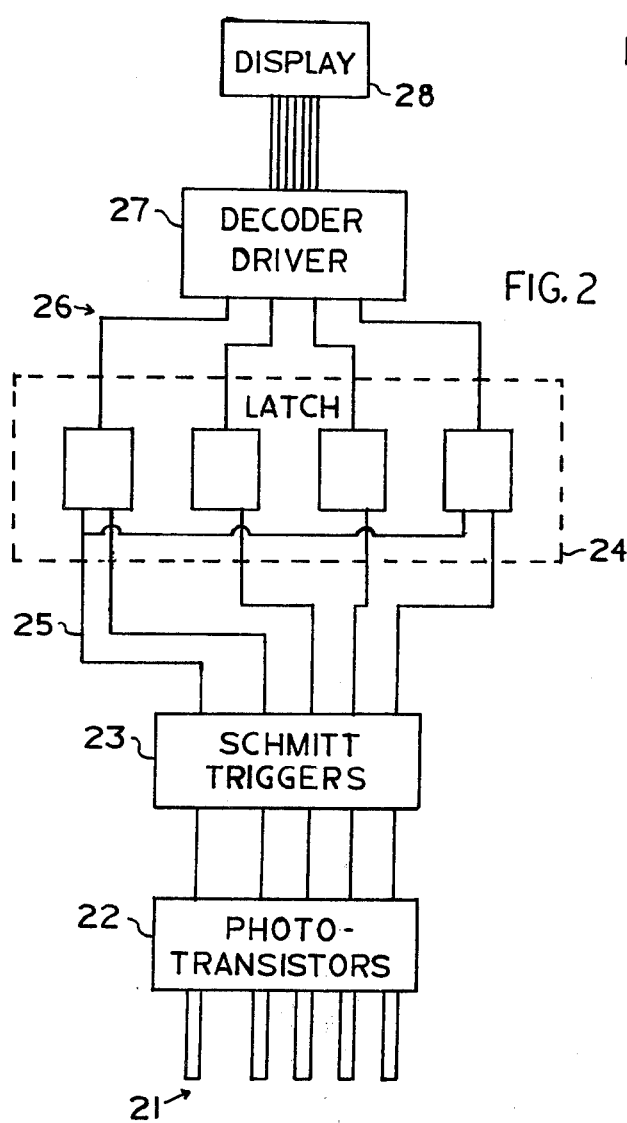
FIG. 2 is a block diagram of the electrical circuit used to convert the optically detected code into electrical signals, and to decode the signals and display the results.

FIG. 2 is a block diagram of the electrical circuit used to sense and interpret coded information from the binary scale for digital display. Optical fibers 21 are used to conduct light proportional to the light and dark areas of the binary code to photosensitive transistors 22. As the light and dark areas of a row of code represent "0s" and "1s", respectively, each fiber carries a "0" or a "1" to the phototransistor to which it is connected so that optical to electrical conversions of the signals can be made. Schmitt triggers 23 are used to condition the electrical output of the phototransistors into a form which is compatible with solid state logic circuits.

Figure 3:
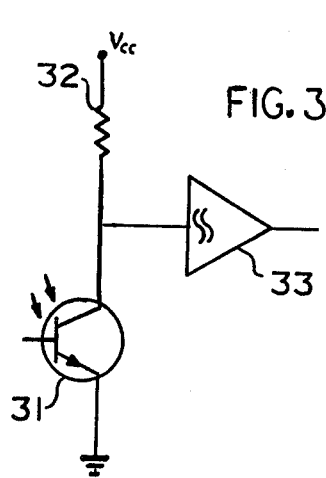
FIG. 3 is a schematic diagram of a circuit used to convert the optically detected code into electrical signals and to condition the signals for logic circuit compatibility.

FIG. 3 is a schematic diagram showing the interfacing of each phototransistor and the Schmitt trigger to which it is connected. Current flowing through phototransistor 31 increases with an increase in the intensity of light impinging its base detector. Phototransistor 31 and resistor 32 comprise a voltage divider such that the voltage at the collector of phototransistor 31 is normally high for low light intensity and is low for high light intensity. Schmitt trigger 33 detects the high or low state of the collector of phototransistor 31 and converts it into a "1" or "0", respectively. The described circuit will interpret dark regions on a coded scale as "1s" and light regions as "1s". If it were desirous to have the light regions represent "1s" and the dark regions represent "0s", an inverting Schmitt trigger would be used.

Referring to FIG. 2, latching circuits 24 are used to synchronize the reading of a row of binary code with correct alignment of the optical detectors on the code. When read enable line 25 goes low indicating that row of optical fibers 21 is other than close to center aligned with a row of digital code, the information previously read is latched in and held on output lines 26. Output lines 26 remain in their state until read enable line 25 goes high indicating that the detectors are correctly aligned with a row of code. The information with which the fibers are correctly aligned is then transferred to output lines 26. The binary code output from latching circuits 24 is decoded by decoder driver circuit 27 which, in turn, controls the display of decimal digits on digital display 28. Thus, the circuit in FIG. 2 reads information from the scale of binary code and displays it on a decimal digital readout. The circuits of FIG. 2 represented by block diagrams 23, 24, 27, and 28 are state of the art and commercially available as packaged units.

Figure 4:
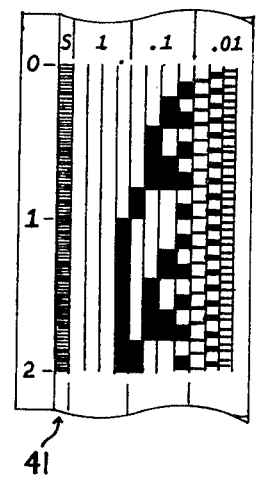
FIG. 4 shows a lengthwise scaled binary encoded decimal scale with a sync column. Distances are read in inches from 0 to 2 in increments of 0.02.

FIG. 4 shows a binary coded scale from which distances can be read. The scale is 2 inches long and the code shown displays distance from 0 to 2 inches in increments of 0.02. The figure shows the number of columns or binary bits needed to encode three digit decimal, 0 to 999, plus a column of sync bits. Thirteen columns are shown, one column for the sync indicators and three sets of four columns, each set sufficient for displaying a digit between 0 to 9 inclusive in binary code. A digital readout used to display information detected from this scale would appropriately have a decimal point located after the first digit. From left to right, the first four columns display ones units, the second four display tenths units, and the third display hundredths units. The distances are read at the locations of sync indicators 41. The last reading taken is held on the display when the optical detector is aligned in between sync indicators. FIG. 4 is intended to give an appreciation for the lack of accuracy inherent to conventional mechanical analog to digital converters because of the requirement that the digital code occupy area on the scale from which the conversions are to be made. This scale can be used to interpret a distance to within ±0.02 inches. More accurate readings would require breaking the scale into smaller increments giving rows of coded information every 0.01 inch or every 0.001 inch. The limit to how much the increments can be decreased is dependent upon the techniques used to make and to read the scale.

Figure 5:
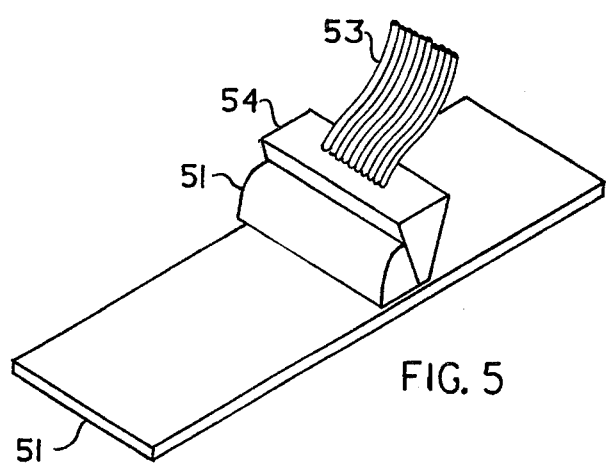
FIG. 5 shows a light source, a scale of coded information, a mount for a set of optical fibers, and a set of optical fibers. The arrangement shown facilitates the reading of the scale.

FIG. 5 shows a method of reading coded information from the surface of translucent or opaque material 51. Reflector 52 reflects light eminating from a light source underneath it onto the coded information beneath optical fibers 53. The fibers are held in place by fiber mount 54. The amount of light being conducted to the phototransistor to which a given optical fiber is connected will depend on whether or not a light or dark region is beneath the fiber. Thus, the code can be read and transmitted to the electrical circuit of FIG. 2.

FIG. 6 is a drawing of a retractable measuring tape. Tape ruler 61 is shown partially extended from case 62. Case 62 is shown partially cut away to reveal the remainder of tape 61 coiled inside.

Binary coded scale 63 is located on tape ruler 61 so that as tape 61 is extended from case 62, the distance to which it is extended can be read by optical detector 64, which is attached to case 62, and subsequently displayed on digital readout 65 which is also attached to case 62. A portion of optical detector 64 is revealed in the cutaway region of case 62. Shown are optical fibers 66, phototransistor 67, light source 68, and reflector 69.

FIG. 7 depicts an alternate method and one which offers the most accuracy in mechanically making distance measurements using a binary coded scale. Information has been encoded into binary onto high resolution film. Photographic techniques are used to encode information at extremely small distance increments by using extremely small characters. Luminescent plate 72 and light source 73, both on the bottom side of film 71, cause light to be passed through clear regions and to be obstructed by dark regions of the film. Distance is encoded on the film in terms of transparent and opaque areas forming a scale. Distances can be measured by detecting and decoding digital information at locations on the scale selected by means of a mechanical device which accepts distance as an input and displaying the results on a digital readout. High powered one dimensional magnifying lens 74 has a field of view on the order of the size of the characters on film 71. This is taken to advantage to focus on one row of code and to magnify it sufficiently for conduction by optical fibers 75. Lens 74 focuses on the row of information centered beneath it so that the binary encoded distances can be read. Lens 74, FIG. 8, illustrates a more descriptive drawing of the lens shown in FIG. 7. Since a one dimensional lens magnifies a row of characters in only one dimension, the size of the characters in the other dimension must already have the magnitude necessary for a row of code to be read. For this reason the rows of coded binary will appear on a scale as a series of lines and spaces in a manner similar to that shown by coded rows 71 in FIG. 8.

FIG. 9 shows a second preferred embodiment of the present invention. FIG. 9 illustrates a device used for measuring thickness. Sliding member 91 moves along support rail 92 so that distance is measured between inside face 93 of sliding member 91 and inside 94 of vertical end member 95 attached to support rail 92. The principles previously discussed are used to give a digital readout, on digital display 96, of the distance between the two inside faces by reading the distance from binary coded scale 97 at the location aligned with the position of sliding member 91. Binary coded scale 97 is physically attached to the side of support rail 92. Optical detectors are attached to sliding member 91 so that distances can be read.

What is claimed is:

1. An improved device for providing a digital readout of distance measurements, said device comprising:
   a. a first member, a second member and a coded scale, said coded scale being fixed to said first member, said second member being moveably coupled to said first member in a manner which facilitates the measurement of distance by said device by positioning said second member at a location on said coded scale corresponding to the magnitude of the distance being measured, said coded scale exhibiting a one to one correspondence with discrete distance magnitudes, discrete locations on said coded scale and the coded information at those locations;
   b. an optical detection system attached to said second member for reading said coded scale, said optical detection system comprising a lens, and a plurality of light conducting fibers and phototransistors, said lens being focused on said coded scale so that it magnifies the image of the code at the location of said coded scale with which said second member is aligned, the alignment of said second member corresponding to the alignment of said lens, said light conducting fibers being positioned for optically coupling the image magnified by said lens to said phototransistors, said phototransistors being operative for converting the image magnified by said lens into electrical signals;

c. a signal conditioning circuit connected to said phototransistors, said signal conditioning circuit receiving electrical signals from said phototransistors and generating conditioned, electrical signals in response thereto;

d. a latching circuit, said latching circuit receiving electrical signals being output from said signal conditioning circuit by means of electrical connections, said latching circuit synchronizing the loading of information into its output with correct alignment of said optical detection system with a row of code being read and holding the information last read when alignment is off;

e. a decoder and a digital display, said decoder being connected to said latching circuit and interpreting the information being output therefrom and supplying driving signals by means of electrical connections to said digital display for digital readout of information representative of that read from said coded scale;

f. said device incorporating integrated circuits in order to form a compact unit having all associated electrical circuitry physically located inside said device and having said digital display physically attached to said device.

2. A device as described in claim 1 wherein said coded scale is in binary coded decimal and the alignment of each of said optical fibers corresponds to a bit of binary in a given row of code, said coded scale exhibiting a column of synchronizing bits which assure correct alignment of said optical detection system with a row of coded information before reading the information can take place.

3. A device as described in claim 2 wherein information is placed on said coded scale in adjoining rows using characters sizes which require the use of photographic reducing techniques or other techniques using optical lenses or mirrors to yield a distance with a desired degree of accuracy.

4. A device as described in claim 3 wherein said coded scale is placed on photographic film.

5. A device as described in claim 1 wherein the distance read from said scale is the distance between two facing surfaces, one attached to said first member and the other attached to said second member, said device forming a caliper.

6. A device as described in claim 1 wherein said first member is a tape and said second member is a case, said first member being retractable into said second member and the distance read from said scale is the distance to which said tape is extended from said case, said device forming a retractable tape ruler.

* * * * *